(12) United States Patent
Deng et al.

(10) Patent No.: US 9,961,292 B1
(45) Date of Patent: May 1, 2018

(54) IMAGING SENSOR WITH AMPLIFIER HAVING VARIABLE BIAS AND INCREASED OUTPUT SIGNAL RANGE

(71) Applicant: OMNIVISION TECHNOLOGIES, INC., Santa Clara, CA (US)

(72) Inventors: Liping Deng, Cupertino, CA (US); Zheng Yang, San Jose, CA (US); Chun-Ming Tang, San Jose, CA (US); Tiejun Dai, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days. days.

(21) Appl. No.: 15/420,531

(22) Filed: Jan. 31, 2017

(51) Int. Cl.
*H04N 5/378* (2011.01)
*H03F 3/08* (2006.01)

(52) U.S. Cl.
CPC ............ *H04N 5/378* (2013.01); *H03F 3/082* (2013.01)

(58) Field of Classification Search
CPC ........ H04N 5/378; H04N 5/361; H04N 5/365; H04N 5/3655; H04N 5/3575; H04N 5/363; H04N 9/045; H03F 3/082
See application file for complete search history.

(56) References Cited

U.S. PATENT DOCUMENTS

| | | | |
|---|---|---|---|
| 6,031,219 A * | 2/2000 | Shuke | H04B 10/6911 250/214 A |
| 6,252,462 B1 | 6/2001 | Hoffman | |
| 8,258,451 B2 | 9/2012 | Vampola et al. | |
| 8,687,100 B2 * | 4/2014 | Toyama | H04N 5/335 348/308 |
| 9,172,873 B2 | 10/2015 | Yang et al. | |
| 9,219,449 B2 | 12/2015 | Yang et al. | |
| 9,838,631 B2 * | 12/2017 | Araoka | H03M 1/34 |
| 2015/0077610 A1 * | 3/2015 | Shishido | H04N 5/378 348/303 |
| 2016/0277696 A1 * | 9/2016 | Jung | H04N 5/378 |

OTHER PUBLICATIONS

Fowler, B. et al., "Low FPN High Gain Capacitive Transimpedance Amplifier for Low Noise CMOS Image Sensors", Proceedings of SPIE—The International Society for Optical Engineering, 4306:68-77, 10 pages.

* cited by examiner

*Primary Examiner* — Luong T Nguyen
(74) *Attorney, Agent, or Firm* — Christensen O'Connor Johnson Kindness PLLC

(57) ABSTRACT

A pixel circuit includes a photodiode, and a transfer transistor coupled to the photodiode. A floating diffusion is coupled to the transfer transistor coupled to transfer image charge from the photodiode to the floating diffusion. An amplifier circuit includes an input coupled to the floating diffusion, an output coupled to generate an image data signal of the pixel circuit, and a variable bias terminal coupled to receive a variable bias signal. A reset switch is coupled between the output and input of the amplifier circuit to reset the amplifier circuit in response to a reset signal. A variable bias generator circuit is coupled to generate the variable bias signal in response to a reset signal to transition the variable bias signal from a first bias signal value to a second bias signal value in response to a transition of the reset signal from an active state to an inactive state.

21 Claims, 3 Drawing Sheets

IMAGING SENSOR WITH AMPLIFIER HAVING VARIABLE BIAS AND INCREASED OUTPUT SIGNAL RANGE

BACKGROUND INFORMATION

Field of the Disclosure

The present invention relates generally to imaging systems, and more particularly to image sensor amplifiers.

Background

Image sensors have become ubiquitous. They are widely used in digital cameras, cellular phones, security cameras, as well as, medical, automobile, and other applications. The technology used to manufacture image sensors, and in particular, complementary metal-oxide-semiconductor (CMOS) image sensors, has continued to advance at great pace. For example, the demands of higher resolution and lower power consumption have encouraged the further miniaturization and integration of these image sensors.

In conventional CMOS image sensors, the pixel circuits typically generate the image data output signals with amplifier circuits. Designers typically attempt to implement the amplifier circuits to have high charge to voltage conversion ratios, with relatively small referred noise contributed by the backend readout circuitry. These efforts are becoming increasingly challenging due to the small size, high speed, and low power requirements of modern image sensors. For example, the output signal range of image sensor amplifier circuits may be reduced due to reset switch charge injection and clock feed-through to the input nodes when the pixel circuit reset switches are turned off. In some instances, the output signal range reduction is as large as 20%.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
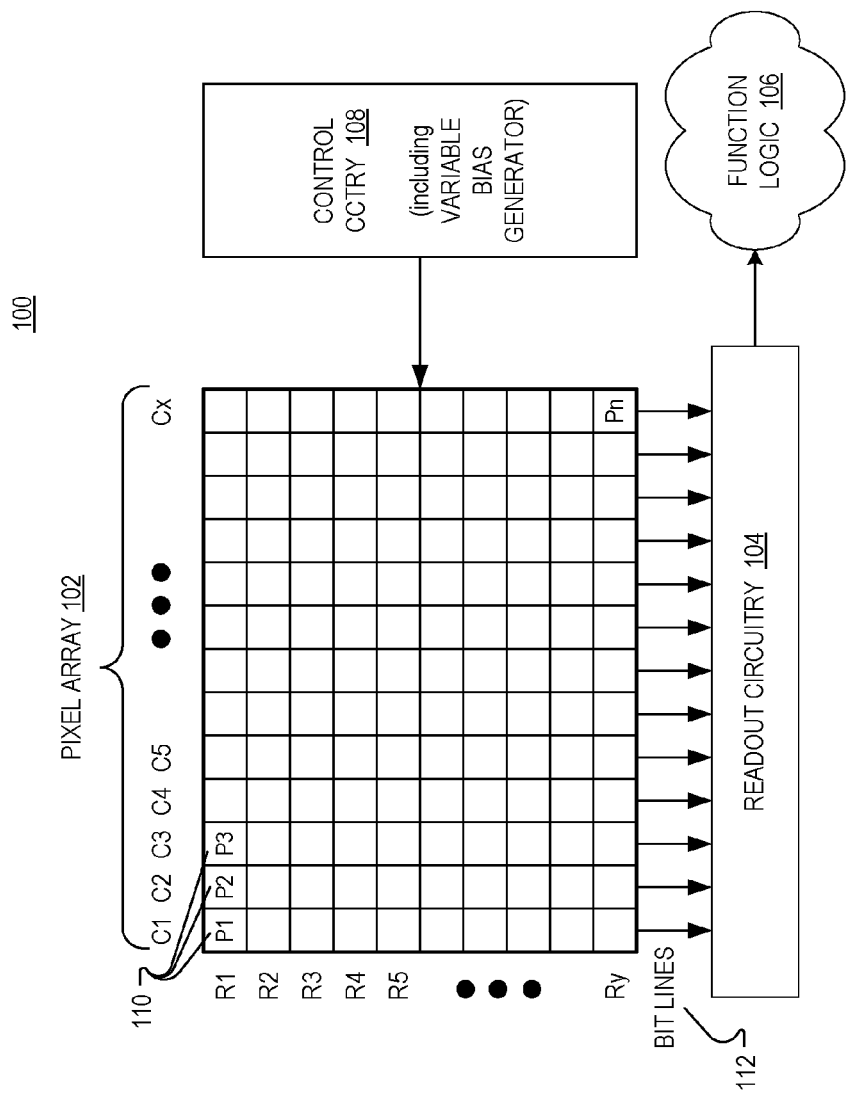
FIG. 1 is a diagram illustrating one example of imaging system including a pixel array in which each pixel circuit of the pixel array includes an amplifier circuit with a variable bias signal input and improved output signal range in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. For example, the term "or" is used in the inclusive sense (e.g., as in "and/or") unless the context clearly indicates otherwise. It should be noted that element names and symbols may be used interchangeably through this document (e.g., Si vs. silicon); however, both have identical meaning.

As will be shown, an example of a pixel circuit for use in an imaging sensor is implemented with pixel circuits that include amplifier circuitry with an improved output signal range. For instance, in various examples, the amplifier circuitry included in the pixel circuits are implemented with cascode amplifier circuits that utilize capacitive transimpedance amplifiers to achieve high charge to voltage conversion ratios, with relatively small referred noise contributed by the backend readout circuitry. In the depicted examples, the amplifier circuits coupled to biased with variable bias signals, which improve the output signal ranges of the amplifier circuits in accordance with the teachings of the present invention.

To illustrate, FIG. 1 is a diagram illustrating one example of an imaging system 100 including a pixel array 102 in which each pixel circuit 110 includes an amplifier circuit coupled to biased with a variable bias signal. As shown in the depicted example, imaging system 100 includes pixel array 102 coupled to control circuitry 108 and readout circuitry 104, which is coupled to function logic 106. As in indicated, in one example, the control circuitry 108 may include variable bias generator circuitry that is coupled to generate variable bias signals that are coupled to bias the pixel circuits 110 included in the pixel array 102 in accordance with the teachings of the present invention.

In one example, pixel array 102 is a two-dimensional (2D) array of image sensor pixel circuits 110 (e.g., P1, P2, P3, . . . , Pn). As illustrated, each pixel circuit 110 is arranged into a row (e.g., rows R1 to Ry) and a column (e.g., column C1 to Cx) to acquire image data of a person, place, object, etc., which can then be used to render a 2D image of the person, place, object, etc. As will be discussed in further detail below, the amplifier circuit included in each one of the pixel circuits 110 has improved output signal range with the variable biasing provided with the variable bias signal generated by a variable bias generator in accordance with the teachings of the present invention.

In one example, after each pixel circuit 110 (e.g., P1, P2, P3, . . . , Pn) has acquired its image data or image charge in a respective photodiode included in the pixel circuit, the image data is transferred from the photodiode to a floating diffusion. The floating diffusion is coupled to the amplifier circuit included in the pixel circuit 110, which is biased with the variable bias signal. The image data generated at the output of the amplifier circuit of each pixel circuit 110 is then readout by readout circuitry 104 through bitlines 112, and then transferred to function logic 106.

In various examples, readout circuitry 104 may also include amplification circuitry, analog-to-digital (ADC) conversion circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may readout a row of image data at a time along readout column lines (illustrated) or may readout the image data using a variety of other techniques (not illustrated), such as a serial readout or a full parallel readout of all pixels simultaneously.

In one example, control circuitry 108 is coupled to pixel array 102 to control the operational characteristics of pixel circuits 110 of pixel array 102. In one example, in addition to providing the variable bias signals, the control circuitry 108 may also be coupled to generate a global shutter signal for controlling image acquisition for each pixel circuit 110. In the example, the global shutter signal simultaneously enables all pixel circuits 110 (e.g., P1, P2, P3, . . . Pn) within pixel array 102 to simultaneously enable all of the pixel circuits 110 in pixel array 102 to simultaneously transfer the image charge from each respective photodetector during a single acquisition window.

Figure 2:
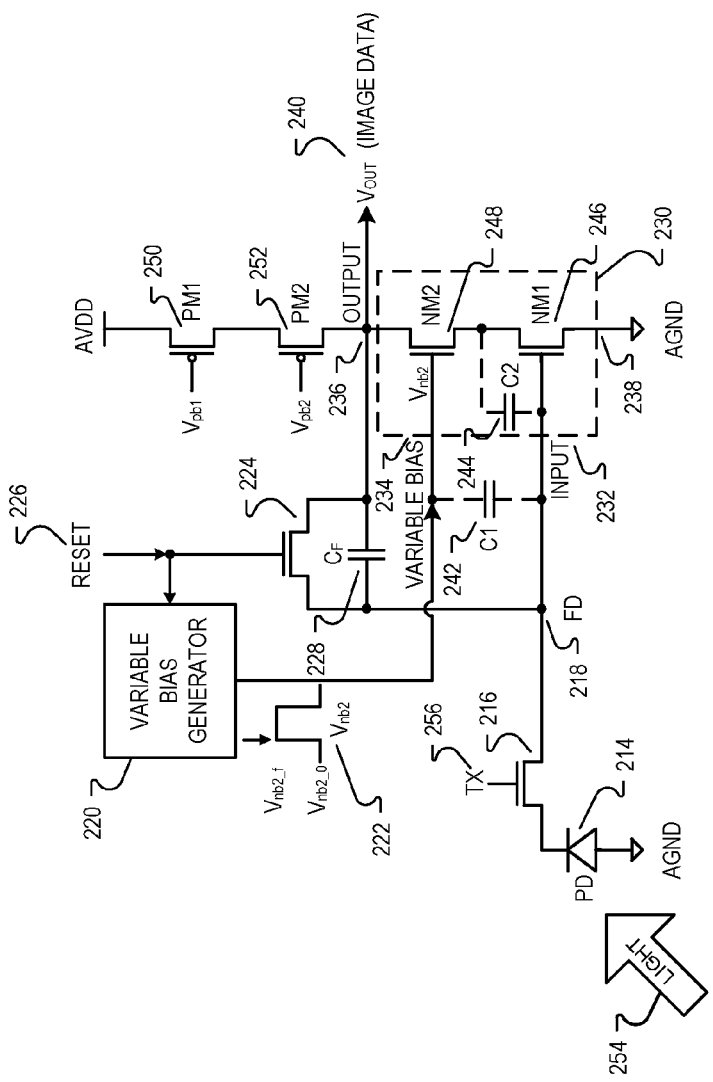
FIG. 2 is a diagram illustrating one example of a pixel circuit with an amplifier circuit with a variable bias signal input and improved output signal range in accordance with the teachings of the present invention.

FIG. 2 is a diagram illustrating one example of a pixel circuit 210 including an amplifier circuit 230 that is biased with a variable bias signal $V_{nb2}$ 222 in accordance with the teachings of the present invention. It is noted that pixel circuit 210 may be an example of one of the pixel circuits 110 of pixel array 102 of FIG. 1, and that similarly named and numbered elements referenced below are coupled and function similar to as described above. As shown in the example depicted in FIG. 2, pixel circuit 210 includes a photodiode PD 214 coupled to photogenerate image charge in response to incident light 254. A transfer transistor 216 is coupled to the photodiode PD 214, and a floating diffusion FD 218 is coupled to the transfer transistor 216. The transfer transistor 216 is coupled to transfer the image charge photogenerated in the photodiode PD 214 from the photodiode PD 214 to the floating diffusion FD 218 in response to a transfer signal TX 256.

As shown in the depicted example, amplifier circuit 230 includes an input terminal 232 coupled to the floating diffusion FD 218. The amplifier circuit 230 includes an output terminal 236 that is coupled to generate an output voltage $V_{OUT}$, which is the image data signal 240 output of the pixel circuit 210 that is generated in response to the image charge at floating diffusion FD 218. In the depicted example, the amplifier circuit 230 also includes a variable bias terminal 234, which is coupled to receive a variable bias signal $V_{nb2}$ 222 to bias the amplifier circuit 230. In addition, amplifier circuit 230 also includes a ground reference terminal 238, which is coupled to a ground reference voltage AGND. A reset switch 224 is coupled between the output terminal 236 and the input terminal 232 of the amplifier circuit to reset the amplifier circuit in response to a reset signal 226. In one example, the reset signal 226 is a digital signal, and therefore transitions between active and inactive states (e.g., between logical high and logical low values) to turn on and turn off the reset switch 224. In one example, the active state may be represented for example by a voltage supply AVDD, and the inactive state may be represented for example by a voltage of zero. The depicted example also illustrates that the pixel circuit 210 includes a feedback capacitor $C_F$ 228 coupled between the output terminal 236 and input terminal 232 of the amplifier circuit 230.

A variable bias generator circuit 220 is coupled to receive the reset signal 226 to generate the variable bias signal $V_{nb2}$ 222 in response to the reset signal 226. In one example, the variable bias generator circuit 220 may be included in the control circuitry 108. In operation, the variable bias signal $V_{nb2}$ 222 may be an analog signal, and the variable bias generator circuit 220 is coupled to transition the variable bias signal $V_{nb2}$ 222 from a first bias signal value (e.g., $V_{nb2\_0}$) to a second bias signal value (e.g., $V_{nb2\_f}$) in response to a transition of the reset signal 226 from the active state to the inactive state. For instance, the example depicted in FIG. 2 illustrates an example pulse of variable bias signal $V_{nb2}$ 222. As indicated with the arrow, the variable bias signal $V_{nb2}$ 222 transitions from first bias signal value $V_{nb2\_0}$ to the second bias signal value $V_{nb2\_f}$ in response to transition of the reset signal 226 from the active state to the inactive state (i.e., a falling edge of the reset signal 226). As shown in the depicted example, the second bias signal value $V_{nb2\_f}$ of the variable bias signal $V_{nb2}$ 222 is greater than the first bias signal value $V_{nb2\_0}$ of the variable bias signal $V_{nb2}$ 222.

In one example, the amplifier circuit 230 is a cascode amplifier that is implemented with a capacitive transimpedance amplifier. For instance, as shown in the example depicted in FIG. 2, amplifier circuit 230 includes a first transistor NM1 246 coupled to a second transistor NM2 248. Each transistor includes a respective control terminal and first and second terminals. For instance, in the depicted example, the first transistor NM1 246 and second transistor NM2 248 are NMOS field effect transistors. As such, the control terminals of the first transistor NM1 246 and second transistor NM2 248 are therefore gate terminals, the first terminals of the first transistor NM1 246 and second transistor NM2 248 are source terminals, and the second terminals of the first transistor NM1 246 and second transistor NM2 248 are drain terminals.

Accordingly, with respect to the example depicted in FIG. 2, the control terminal of the first transistor NM1 246 is coupled to the input terminal 232 of the amplifier circuit 230, and the first terminal of the first transistor NM1 246 is coupled to the ground reference terminal 238 of the amplifier circuit 230 to the ground reference voltage AGND. The control terminal of the second transistor NM2 248 is coupled to the variable bias terminal 234 of the amplifier circuit 230 to receive the variable bias signal $V_{nb2}$ 222, the first terminal of the second transistor NM2 248 is coupled to the second terminal of the first transistor NM1 246, and the second terminal of the second transistor NM2 248 is coupled to the output terminal 236 of the amplifier circuit 230 to generate the output voltage $V_{OUT}$, which is the image data signal 240 output by the pixel circuit 210. The example depicted in FIG. 2 also represents a coupling capacitance C1 242 between the gate terminal of second transistor NM2 248 and the input terminal 232, while the capacitance C2 244 represents a total capacitance between the drain terminal of first transistor NM1 246 and the input terminal 232.

In the example, the pixel circuit 210 also includes third and fourth transistors PM1 250 and PM2 252, respectively, which are coupled between the voltage supply AVDD and the output terminal 236 of the amplifier circuit 210 as shown. In the depicted example, the third transistor PM1 250 and fourth transistor PM2 252 are PMOS field effect transistors. As such, the control terminals of the third transistor PM1 250 and fourth transistor PM2 252 are therefore gate terminals, the first terminals of the third transistor PM1 250 and fourth transistor PM2 252 are source terminals, and the second terminals of the third transistor PM1 250 and fourth transistor PM2 252 are drain terminals.

Accordingly, referring back to the example depicted in FIG. 2, the control terminal of the third transistor PM1 250 is coupled to a first bias voltage $V_{pb1}$, the control terminal of the fourth transistor PM2 252 is coupled to a second bias voltage $V_{pb2}$, the first terminal of the third transistor PM1 250 is coupled to the voltage supply AVDD, the second terminal of the third transistor PM1 250 is coupled to the first terminal of the fourth transistor PM2 252, and the second terminal of the fourth transistor PM2 252 is coupled to the output terminal 236 of the pixel circuit 210.

Figure 3:
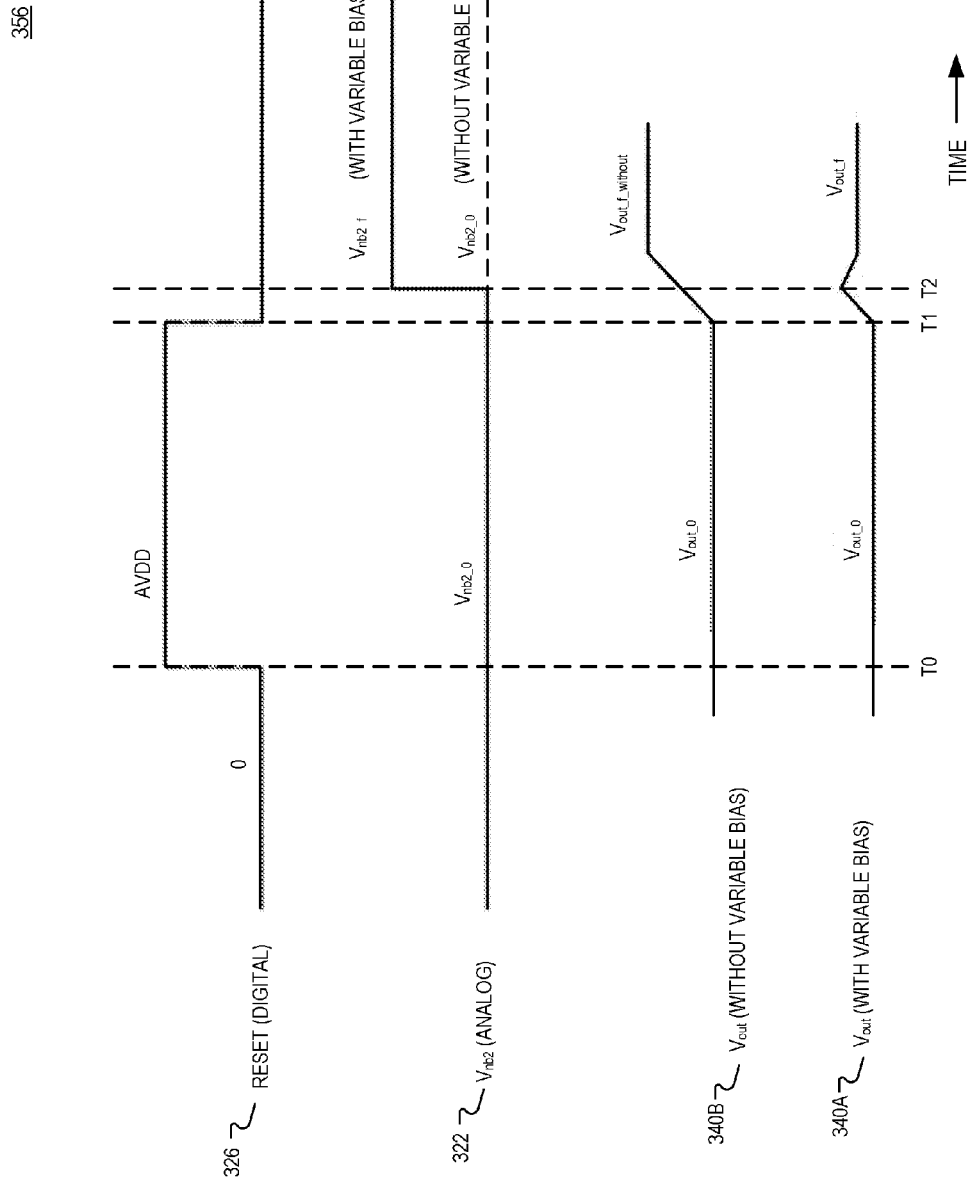
FIG. 3 is a timing diagram illustrating one example of signals of an example pixel circuit with an amplifier circuit with a variable bias signal input and improved output signal range in accordance with the teachings of the present invention.

FIG. 3 is a timing diagram 356 illustrating one example of signals of an example amplifier circuit biased with a variable bias signal included in pixel circuit in accordance with the teachings of the present invention. It is noted that example signals described in FIG. 3 may correspond to signals found in the example pixel circuits 110 of pixel array 102 of FIG. 1, and/or pixel circuit 210 of FIG. 2, and that similarly named and numbered elements referenced below are coupled and function similar to as described above.

As shown in the example depicted in FIG. 2, before time T0, the reset signal 326 is at an inactive state, or zero. Thus, at this time the reset switch (e.g., reset switch 224) is turned off, and the variable bias signal $V_{nb2}$ 322 (e.g., output of variable bias generator 220) is at a lower bias signal value $V_{nb2\_f}$.

At time T0, the reset signal 326 transitions from the inactive state (e.g., zero) to an active state (e.g., AVDD). Thus, at this time the reset switch (e.g., reset switch 224) is turned on, which causes a reset phase to occurs in the amplifier circuit (e.g., amplifier circuit 230). During the reset phase with reset signal 326 at the active state, the output terminal 236 of the amplify circuit 230 is short circuited to the input terminal 232 through the reset switch 224, which initializes the output voltage $V_{OUT}$ of the image data signal 240 to a voltage $V_{out\_0}$.

At time T1, the reset signal 326 transitions from the active state (e.g., AVDD) to the inactive state (e.g., zero), which ends the reset phase and allows normal operation of the amplifier circuit 230 to begin, which causes the output voltage $V_{OUT}$ to increase after time T1. As illustrated in FIG. 3, the output voltage $V_{OUT}$ is illustrated in one example with $V_{OUT}$ 340A showing the output voltage $V_{OUT}$ increasing with a variable bias signal, and in another example with $V_{OUT}$ 340B showing a hypothetical output voltage $V_{OUT}$ without a variable bias signal (i.e., a constant or fixed bias signal at $V_{nb2\_0}$). As illustrated, the output voltage $V_{OUT}$ begins to rise away from its initial voltage $V_{out\_0}$ after time T1, which is after the reset switch 224 is turned off.

As illustrated with output voltage $V_{OUT}$ 340B, if the amplifier circuit 230 is biased with a bias signal $V_{nb2}$ 322 that is fixed at $V_{nb2\_0}$ (i.e., without a variable bias), when the reset switch 224 is turned off, the output voltage $V_{OUT}$ 340B increases significantly due to the reset switch's charge injection and clock feed-through. As such, the output voltage $V_{OUT}$ 340B rises to a much higher voltage $V_{out\_f\_without}$ compared to the initial voltage $V_{out\_0}$, which consequently results in a higher minimum voltage for output voltage $V_{OUT}$, and therefore causes an output signal range reduction. In particular, the output signal range $V_{OUT\_RANGE}$ may be expressed with the relationship:

$$V_{OUT\_RANGE} = V_{MAX} - V_{MIN},$$

where $V_{MAX}$ is the maximum output voltage and $V_{IN}$ is the minimum output voltage. Therefore, a lower VMIN allows for a wider output signal range for $V_{OUT\_RANGE}$, since $V_{MAX}$ is fixed value.

In comparison, instead of keeping the bias signal $V_{nb2}$ 322 fixed at $V_{nb2\_0}$, (i.e., without variable bias), output voltage $V_{OUT}$ 340A illustrates the example in which the bias signal $V_{nb2}$ 322 is varied (i.e., with variable bias) at time T2, after the reset signal 326 transitions from the active state to the inactive state at time T1. As shown in FIG. 3, output voltage $V_{OUT}$ 340A drops at time T2 after the variable bias signal $V_{nb2}$ 322 transitions from $V_{nb2\_0}$ to $V_{nb2\_f}$ at time T2. As shown in the illustrated example, $V_{nb2\_f}$ is greater than $V_{nb2\_0}$. It can be shown that the relationship between the output $V_{OUT}$ and $V_{nb2}$ 322 in low frequency is approximately:

$$V_{out\_f} - V_{out\_0} = -(C1+C2)/C_F(V_{nb2\_f} - V_{nb2\_0}) - G_C,$$

where $V_{out\_f}$ is the settled output voltage $V_{OUT}$ 340A (after time T2) and $V_{out\_0}$ is the output voltage $V_{OUT}$ 340A before time T1. It is appreciated that $G_C$ is the voltage gain from the variable bias signal $V_{nb2}$ 322 to the output through a non-capacitive path, which is normally small for most designs.

Thus, as shown when comparing the output voltage examples $V_{OUT}$ 340B (without variable bias) and $V_{OUT}$ 340A (with variable bias), the output voltage $V_{OUT}$ 340B increases significantly away from the initial reset voltage $V_{out\_0}$ due to charge injection and clock feed-through. For instance, charge injection may be caused by a falling edge of the reset signal 326 as electrons are injected to both the input and output terminals of the amplifier circuit when the reset switch 226 is turned off. Although the injected electrons at the output terminal of the amplifier circuit have relatively little effect, the injected electrons at the input terminal of the amplifier circuit have a larger effect, especially as the capacitance at the floating diffusion FD gets smaller. Indeed, the effects of a ΔQ at the floating diffusion FD are amplified through the amplifier circuit to the output terminal. In addition, the clock feed-through also affects the output voltage of the amplifier circuit with the capacitive voltage divider formed with the parasitic capacitance of the reset switch 226 and the capacitance at the floating diffusion FD having a center node at the input of the amplifier circuit. Thus, as the voltage of the of the reset signal 326 swings, the voltage at the input of the amplifier also swings, which is also amplified through the amplifier circuit to the output terminal.

However, with the variable bias signal $V_{nb2}$ 322 switching from low ($V_{nb2\_0}$) to high ($V_{nb2\_f}$) voltage (without being in the linear region of second transistor NM2 248), the output voltage $V_{OUT}$ 340A is pulled back down towards $V_{out\_0}$, which reduces the minimum output voltage for $V_{OUT}$ 340A after settling. Thus, the output voltage $V_{OUT}$ 340A signal range reduction is improved in accordance with the teachings of the present invention. In this way, the output voltage $V_{OUT}$ 340A signal range can be increased to a maximum signal range by designing proper values for $V_{nb2\_0}$ and $V_{nb2\_f}$ of the variable bias signal $V_{nb2}$ 322 in accordance with the teachings of the present invention.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A pixel circuit, comprising:
   a photodiode coupled to photogenerate image charge in response to incident light;
   a transfer transistor coupled to the photodiode;
   a floating diffusion coupled to the transfer transistor, wherein the transfer transistor is coupled to transfer the image charge from the photodiode to the floating diffusion;
   an amplifier circuit having an input terminal coupled to the floating diffusion, an output terminal coupled to generate an image data signal of the pixel circuit, and a variable bias terminal coupled to receive a variable bias signal;
   a reset switch coupled between the output and input terminals of the amplifier circuit to reset the amplifier circuit in response to a reset signal; and
   a variable bias generator circuit coupled to receive the reset signal to generate the variable bias signal in response to the reset signal, wherein the variable bias generator circuit is coupled to transition the variable bias signal from a first bias signal value to a second bias signal value in response to a transition of the reset signal from an active state to an inactive state.

2. The pixel circuit of claim 1, wherein the amplifier circuit further comprises:
   a first transistor having a control terminal, a first terminal, and a second terminal, wherein the control terminal of the first transistor is coupled to the input terminal of the amplifier circuit, wherein the first terminal of the first transistor is coupled to a ground reference terminal of the amplifier circuit to ground reference voltage; and
   a second transistor having a control terminal, a first terminal, and a second terminal, wherein the control terminal of the second transistor is coupled to the variable bias terminal of the amplifier circuit to receive the variable bias signal, wherein the first terminal of the second transistor is coupled to the second terminal of the first transistor, and wherein the second terminal of the second transistor is coupled to the output terminal of the amplifier circuit.

3. The pixel circuit of claim 2, further comprising third and fourth transistors coupled between a voltage supply and the output terminal of the amplifier circuit.

4. The pixel circuit of claim 3, wherein the third transistor includes a control terminal coupled to a first bias voltage, wherein the fourth transistor includes a control terminal coupled to a second bias voltage, wherein a first terminal of the third transistor is coupled to the voltage supply, wherein a second terminal of the third transistor is coupled to a first terminal of the fourth transistor, and wherein a second terminal of the fourth transistor is coupled to the output terminal of the amplifier circuit.

5. The pixel circuit of claim 4, wherein the first and second transistors comprise NMOS field effect transistors, and wherein the third and fourth transistors comprise PMOS field effect transistors.

6. The pixel circuit of claim 1, wherein the second bias signal value of the variable bias signal is greater than the first bias signal value of the variable bias signal.

7. The pixel circuit of claim 1, further comprising a feedback capacitor coupled between the output and input terminals of the amplifier circuit.

8. The pixel circuit of claim 1, wherein the variable bias generator circuit is coupled to transition the variable bias signal from the first bias signal value to the second bias signal value after the reset switch is turned off in response to the reset signal transitioning from the active state to the inactive state.

9. The pixel circuit of claim 1, wherein a voltage of the image data signal generated at the output terminal of the amplifier circuit is reduced in response to the transition of the variable bias signal from the first bias signal value to the second bias signal value.

10. The pixel circuit of claim 1, wherein the amplifier circuit is a cascode amplifier comprising a capacitive transimpedance amplifier.

11. An image sensing system, comprising:
    a pixel array having a plurality of pixel circuits arranged into a plurality of rows and a plurality of columns, wherein each one of the pixel circuits includes:
       a photodiode coupled to photogenerate image charge in response to incident light;
       a transfer transistor coupled to the photodiode;
       a floating diffusion coupled to the transfer transistor, wherein the transfer transistor is coupled to transfer the image charge from the photodiode to the floating diffusion;
       an amplifier circuit having an input coupled to the floating diffusion, an output terminal coupled to generate an image data signal of the pixel circuit, and a variable bias terminal coupled to receive a variable bias signal;
       a reset switch coupled between the output and input terminals of the amplifier circuit to reset the amplifier circuit in response to a reset signal; and
       a variable bias generator circuit coupled to receive the reset signal to generate the variable bias signal in response to the reset signal, wherein the variable bias generator circuit is coupled to transition the variable bias signal from a first bias signal value to a second bias signal value in response to a transition of the reset signal from an active state to an inactive state;
    control circuitry coupled to the pixel array to control operation of the pixel array; and
    read out circuitry coupled to the pixel array to read out the image data signal from each one of the plurality of pixel circuits.

12. The image sensing system of claim 11, further comprising function logic coupled to the read out circuitry to store the image data signal read out from each one of the plurality of pixel circuits.

13. The image sensing system of claim 11, wherein the amplifier circuit further comprises:
    a first transistor having a control terminal, a first terminal, and a second terminal, wherein the control terminal of the first transistor is coupled to the input terminal of the amplifier circuit, wherein the first terminal of the first transistor is coupled to a ground reference terminal of the amplifier circuit to ground reference voltage; and a second transistor having a control terminal, a first terminal, and a second terminal, wherein the control terminal of the second transistor is coupled to the variable bias terminal of the amplifier circuit to receive the variable bias signal, wherein the first terminal of the second transistor is coupled to the second terminal of the first transistor, and wherein the second terminal of the second transistor is coupled to the output terminal of the amplifier circuit.

14. The image sensing system of claim 13, wherein each one of the pixel circuits further comprises third and fourth transistors coupled between a voltage supply and the output terminal of the amplifier circuit.

15. The image sensing system of claim 14, wherein the third transistor includes a control terminal coupled to a first bias voltage, wherein the fourth transistor includes a control terminal coupled to a second bias voltage, wherein a first terminal of the third transistor is coupled to the voltage supply, wherein a second terminal of the third transistor is coupled to a first terminal of the fourth transistor, and wherein a second terminal of the fourth transistor is coupled to the output terminal of the amplifier circuit.

16. The image sensing system of claim 15, wherein the first and second transistors comprise NMOS field effect transistors, and wherein the third and fourth transistors comprise PMOS field effect transistors.

17. The image sensing system of claim 11, wherein the second bias signal value of the variable bias signal is greater than the first bias signal value of the variable bias signal.

18. The image sensing system of claim 11, wherein each one of the pixel circuits further comprises a feedback capacitor coupled between the output and input terminals of the amplifier circuit.

19. The image sensing system of claim 11, wherein the variable bias generator circuit is coupled to transition the variable bias signal from the first bias signal value to the second bias signal value after the reset switch is turned off in response to the reset signal transitioning from the active state to the inactive state.

20. The image sensing system of claim 11, wherein a voltage of the image data signal generated at the output terminal of the amplifier circuit is reduced in response to the transition of the variable bias signal from the first bias signal value to the second bias signal value.

21. The image sensing system of claim 11, wherein the amplifier circuit is a cascode amplifier comprising a capacitive transimpedance amplifier.

* * * * *